United States Patent
Tomono et al.

(10) Patent No.: US 9,122,824 B2
(45) Date of Patent: Sep. 1, 2015

(54) SYSTEM-ON-CHIP DESIGN STRUCTURE AND METHOD

(71) Applicant: FUJITSU LIMITED, Kawasaki-shi, Kanagawa (JP)

(72) Inventors: Mitsuru Tomono, San Jose, CA (US); Hiroaki Yoshida, Cupertino, CA (US); Kodai Moritaka, Ikomo (JP)

(73) Assignee: FUJITSU LIMITED, Kawasaki (JP)

( * ) Notice: Subject to any disclaimer, the term of this patent is extended or adjusted under 35 U.S.C. 154(b) by 6 days.

(21) Appl. No.: 13/714,771

(22) Filed: Dec. 14, 2012

(65) Prior Publication Data

US 2014/0173252 A1   Jun. 19, 2014

(51) Int. Cl.
*G06F 17/50* (2006.01)
*G06F 15/78* (2006.01)

(52) U.S. Cl.
CPC ........ *G06F 17/5045* (2013.01); *G06F 15/7842* (2013.01)

(58) Field of Classification Search
USPC .......... 716/104, 106, 136, 138; 711/122, 144, 711/145
See application file for complete search history.

(56) References Cited

U.S. PATENT DOCUMENTS

| | | | | |
|---|---|---|---|---|
| 5,914,887 | A * | 6/1999 | Scepanovic et al. | 716/123 |
| 6,058,253 | A * | 5/2000 | Lowe | 716/106 |
| 7,305,540 | B1 * | 12/2007 | Trivedi et al. | 712/3 |
| 7,546,572 | B1 * | 6/2009 | Ballagh et al. | 716/138 |
| 8,402,400 | B1 * | 3/2013 | Perry | 716/100 |
| 8,438,521 | B1 * | 5/2013 | Jackson et al. | 716/116 |
| 2002/0038401 | A1 * | 3/2002 | Zaidi et al. | 710/305 |
| 2004/0059871 | A1 * | 3/2004 | Arimilli et al. | 711/122 |
| 2004/0260879 | A1 * | 12/2004 | Barroso et al. | 711/122 |
| 2006/0031791 | A1 * | 2/2006 | Moona et al. | 716/3 |
| 2007/0277130 | A1 * | 11/2007 | Lavelle | 716/4 |
| 2010/0180240 | A1 * | 7/2010 | Davis et al. | 716/5 |

OTHER PUBLICATIONS

Segars, Simon, "ARM Processor Evolution: Bringing Home Performance to Mobile Devices", Hot Chips HC23: A Symposium on High Performance Chips, Aug. 17-19, 2011.

\* cited by examiner

*Primary Examiner* — Brian Ngo

(74) *Attorney, Agent, or Firm* — Maschoff Brennan

(57) ABSTRACT

Aspects may include a method of designing a system-on-chip. The method may include receiving multiple processing modules, each representing in software one of multiple processing units of a system-on-chip. The method may further include modeling communications from one or more of the multiple processing modules as accesses to memory. The method may further include generating a coherent memory module associated with the multiple processing modules based on modeling the communications from the one or more of the multiple processing modules as accesses to memory. The coherent memory module may represent in software a coherent memory associated with the multiple processing units.

8 Claims, 6 Drawing Sheets ary and explanatory and are not restrictive of the invention,
SYSTEM-ON-CHIP DESIGN STRUCTURE AND METHOD

FIELD

The embodiments discussed herein are related to system-on-chip (SOC) design structures and SOC design methodologies.

BACKGROUND

An SOC is generally an integrated circuit (IC) that integrates multiple components of a computer or other electronic system onto a single chip. Often, SOCs will contain multiple processing units designed for application-specific processing tasks. Generally, SOCs may consume less power, less space, and have a higher reliability than a multi-chip system they replace. As a result, SOCs are often included in computer and/or electronic devices, particularly portable devices.

Designing an SOC is a complex and time-consuming process. Generally, a high-level design description of the processing units and other function blocks of the SOC are created in C programming language, SystemC, or the like. Hardware synthesis may be employed to automatically synthesize a hardware description from the high-level design description. The processing units are designed in a high-level design description and are synthesized into a hardware description. Use of high-level synthesis may generally reduce the design cost of the processing units and other functional blocks compared to designing the hardware directly.

Conversely, interconnects between the processing units, functional blocks, and the like are generally designed using lower level descriptions, such as HDL, rather than high level descriptions that may be used in designing the processing units as described above. These interconnects are generally designed as a bus system that includes various interconnect bus protocols. As a result, all of the processing units in such a system are generally designed to comply with interconnect bus protocols. The path data travels to and from processing units and/or memory locations may be relatively complex due to the bus system and the bus protocols. For example, a piece of data may be moved among processing units and other functional blocks through a series of commands from a direct memory access (DMA) controller. Generally, these bus systems cause data communication by the processing units to represent a first in, first out (FIFO) data stream. Additionally, these bus systems, bus protocols, and interconnections are typically relatively complex. The processing units are designed to comply with a complex bus protocol to communicate data via the interconnect system.

After the processing units and the interconnect system are designed and the processing units are synthesized into a hardware description, the SOC design is functionally verified. Functional verification may take place in specialized, expensive acceleration and/or emulation boxes, or may also be performed via field-programmable gate array (FPGA) prototypes or the like. During functional verification, errors and/or design bugs may be identified. The high-level design description may then be revised in light of the identified errors and/or bugs, resynthesized, and again functionally verified. This iterative process may be repeated until the functional verification is successful. Once the complete SOC design is functionally verified, the SOC may be produced according to the final design.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of designing a system-on-chip includes receiving multiple processing modules, each representing in software one of multiple processing units of a system-on-chip. The method may further include modeling communications from one or more of the multiple processing modules as accesses to memory. The method may further include generating a coherent memory module associated with the multiple processing modules based on modeling the communications from the one or more of the multiple processing modules as accesses to memory. The coherent memory module may represent in software a coherent memory associated with the multiple processing units.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

A traditional system-on-chip (SOC) design methodology has a number of inefficiencies that may result in a complex and/or time-consuming design process. For example, designing a bus interconnect system using lower level descriptions, such as HDL, rather than high level descriptions and designing processing units within an SOC to comply with the bus protocols of the bus interconnect system may be complex and time-consuming. Furthermore, because of the nature of a bus interconnect system, high-level synthesis of processing units within an SOC models communications between the processing units and between the processing units and memory as a first in, first out (FIFO) stream. Because the communications are modeled as a FIFO stream, the processing units' high-level design is difficult to functionally verify in software before the bus interconnect system is designed and synthesized and the processing units are synthesized. Thus, traditional SOC design methodology often calls for functional verification to be conducted after all of the processing units and the bus interconnect system are designed, synthesized, and connected. Consequently, errors and bugs may not be found until late in the design of the SOC. Once errors and bugs are found, the high-level design is updated, re-synthesized, and again functionally verified. Iteratively returning to early stages of the SOC design after discovering errors in the late stages may potentially introduce significant delays to the design phase of SOCs.

Some embodiments described herein may relate to designing an SOC. Designing the SOC may include receiving processing modules representing in software, or another algorithmic-level description, processing units of the SOC. The software representing the processing units may be located in storage of a memory. Communications from the processing modules may be modeled as accesses to memory. A coherent memory module associated with the processing modules may be generated based on the communications from the processing modules being modeled as accesses to memory. The coherent memory module may represent in software a coherent memory associated with the processing units of the SOC. In designing the SOC, communications from the processing modules may be tested based on the processing modules and the coherent memory modules. For example, communications from the processing modules may be tested before performing a hardware synthesis of the processing modules and the coherent memory module. As a result, time, effort, and/or cost may be reducing when designing the SOC.

Embodiments of the present invention will be explained with reference to the accompanying drawings, wherein like features will be provided with like reference designations.

Figure 1:
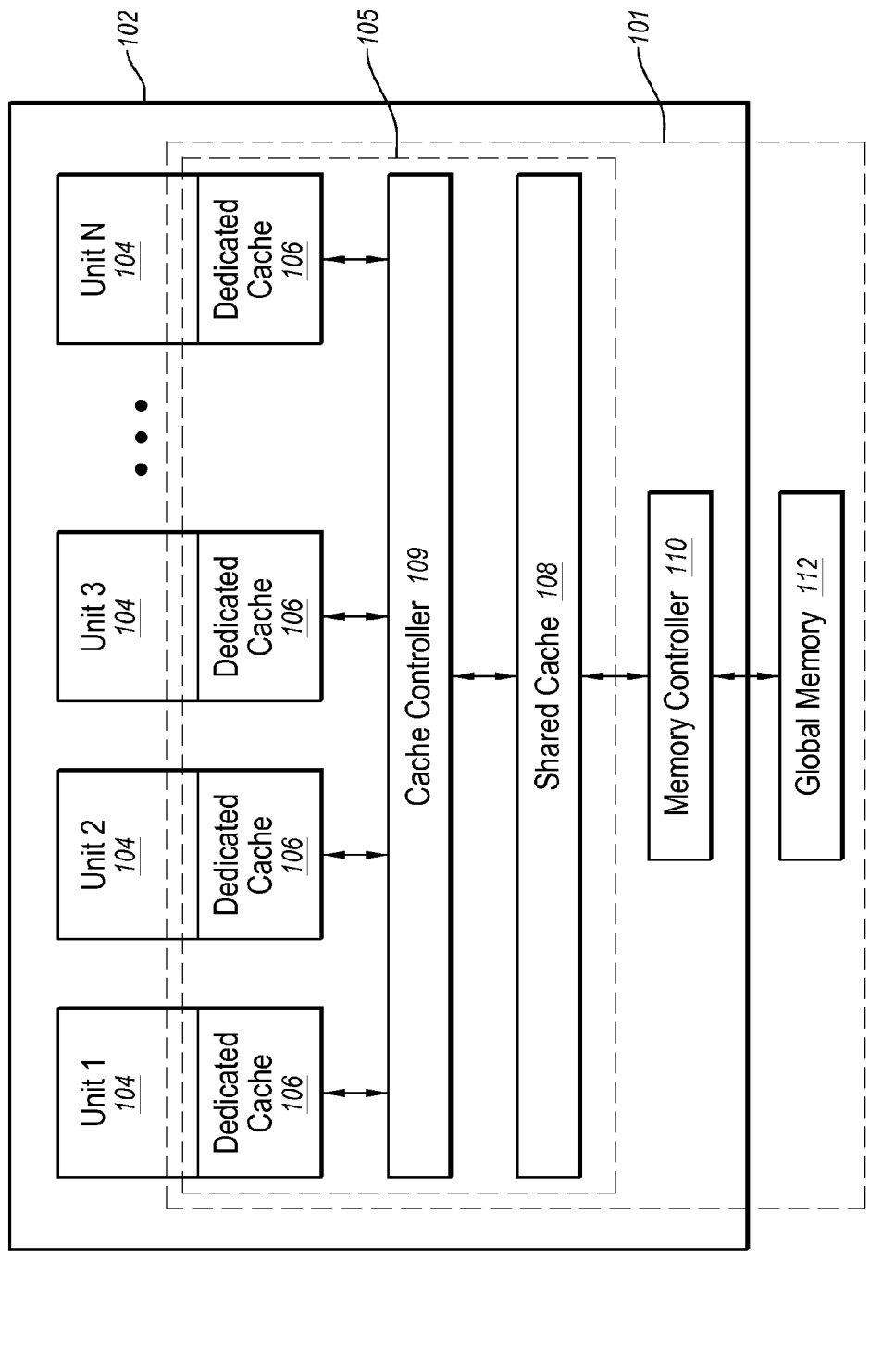
FIG. 1 is a block diagram of an example hierarchal memory system.

FIG. 1 is a block diagram of an example hierarchal memory system 100, arranged in accordance with at least some embodiments described herein. The hierarchal memory system 100 includes a hierarchal memory 101 located in part on an SOC 102. The hierarchal memory system 100 may allow communications from one or more processing units 104 of an SOC 102 to occur as accesses to memory. In some embodiments, the communications from the processing modules may be communications involving reading and writing to memory which may occur as direct accesses to memory and not as requests to access the memory through a direct memory access controller or some other memory controller that uses complex protocols to manage memory access in SOCs and other devices. The multiple processing units 104 may include processing cores, CPUs, graphic processing units (GPUs), video processors, audio processors, hardware accelerators, onboard signal processors, analog signal processors, image signal processors, cryptographic engines, or other types of processors or processing units.

The hierarchal memory 101 may include hierarchal coherent cache 105 on the SOC 102. Alternately or additionally, a portion of the hierarchal coherent cache 105 may be located external to the SOC 102. The hierarchal coherent cache 105 may include dedicated caches 106 and a shared cache 108. Each dedicated cache 106 may be associated with one of the processing units 104. The shared cache 108 may be communicatively coupled to each of the dedicated caches 106. A memory controller 110 may control data transfer between the shared cache 108 and a global memory 112 that is external to the SOC 102.

When a processing unit 104 requests data having a memory location, the dedicated cache 106 associated with the processing unit 104 is checked first. If a copy of the data at the desired memory location is located in the associated dedicated cache 106, the processing unit 104 accesses the data from the associated dedicated cache 106. If a copy of the data at the desired memory location is not located at the associated dedicated cache 106, a cache miss results and the shared cache 108 may be checked for a copy of the data at the desired memory location. If a copy of the data at the desired memory location is located at the shared cache 108, the copy of the data at the desired memory location is copied to the associated dedicated cache 106 for the processing unit 104 to access. If a copy of the data at the desired memory location is not located at the shared cache 108, the data is obtained from the global memory 112 via the memory controller 110.

A cache controller 109 may control the ability of the dedicated caches 106 to read and/or write to the shared cache 108. In some embodiments, the cache controller 109 may receive requests from the dedicated caches 106 to read and/or write to the shared cache 108. The cache controller 109 may respond to each request by indicating whether the requesting dedicated cache 106 has permission to read and/or write to the shared cache 108, or whether the requesting dedicated cache 106 should wait for permission. In some embodiments, the cache controller 109 may control read and/or write access of the dedicated caches 106 based on priority assigned to the processing units 104 or based on some other criteria.

Figure 2:
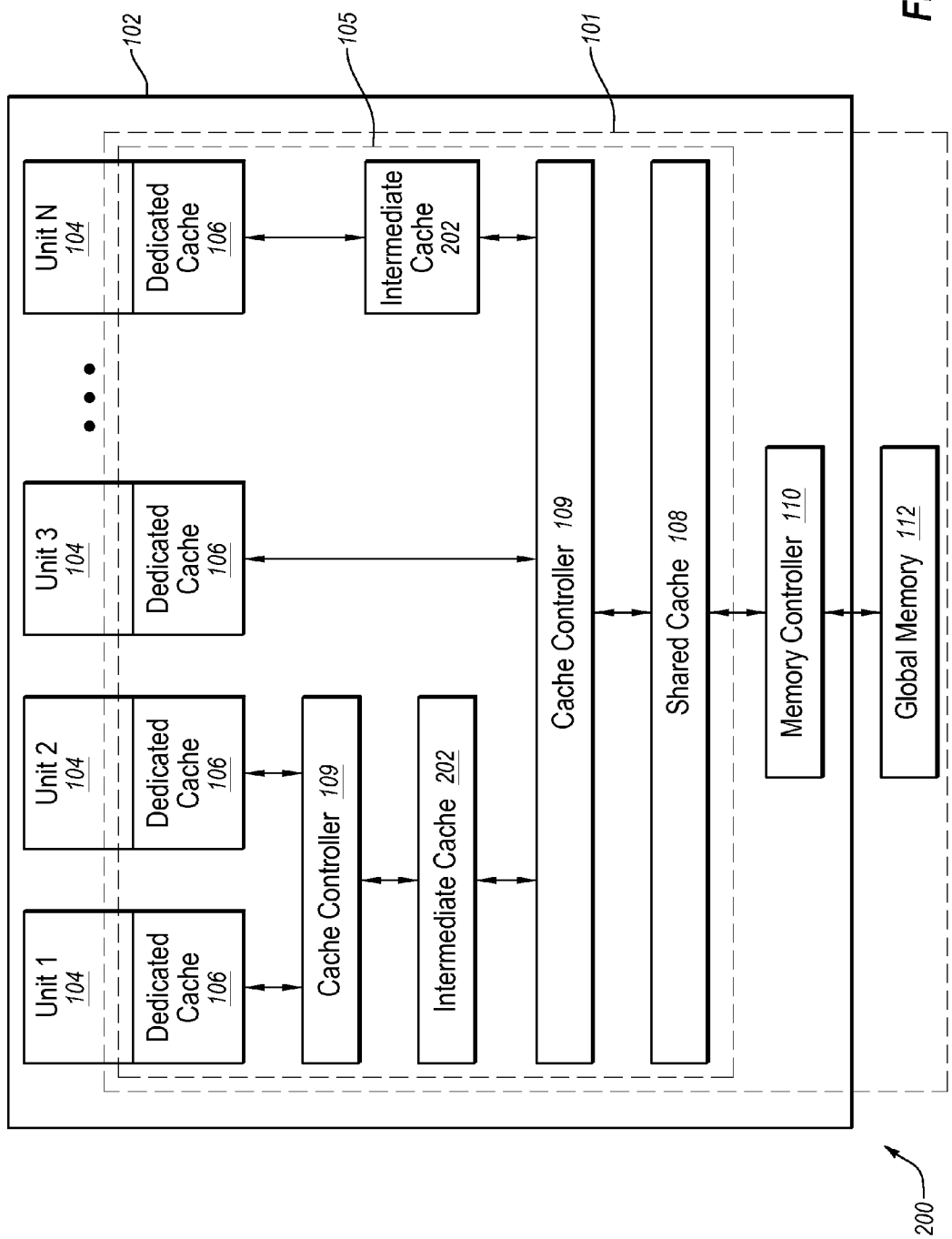
FIG. 2 is a block diagram of another example hierarchal memory system.

FIG. 2 is a block diagram of another example hierarchal memory system 200, arranged in accordance with at least some embodiments described herein. The hierarchal memory 200 may include the hierarchal coherent cache 105 with intermediate caches 202 associated with one or more of the processing units 104. When one of the processing units 104 associated with the intermediate cache 202 requests data from a desired memory location that is not copied at the dedicated cache 106 associated with the one of the processing units 104, the intermediate cache 202 may be checked for the desired memory location before checking the shared cache 106. In some embodiments, an intermediate cache intermediate cache 202 may be associated with all of the dedicated caches 106. Although only one level of intermediate caches 202 is shown, multiple levels of intermediate caches 202 may be included in the hierarchal coherent cache 105.

Referring again to FIG. 1, in some embodiments, the hierarchal coherent cache 105 may be configured to allow cache snooping to promote cache coherency throughout the hierarchal cache 105. However, other systems and/or methods such as directory-based coherence, snarfing, or the like may be employed to promote cache coherency.

In some embodiments, the processing units 104 may support variable-latency memory access, such as variable-latency memory access arising from cache misses. In some embodiments, when a copy of data at a desired memory location is not located at the dedicated cache 106, latency may occur as a copy of the data at the desired memory location is copied to the dedicated cache 106 from the shared cache 108 and/or the global memory 112. In some embodiments, the processing units 104 may wait for the data at the desired memory location to be copied to the dedicated cache 106 following a cache miss. In some embodiments, the processing units 104 may wait for a length of time equal to or greater than the length of time it takes to copy the desired data from the global memory 112. Alternately or additionally, the processing units 104 may wait for a length of time equal to or greater than the length of time it takes to copy the desired data from the shared cache 108. Alternately or additionally, the processing units 104 may be designed to perform other instructions in the time it takes for the data to be copied to the dedicated caches 106 respectively associated with the processing units 104 following a cache miss.

Advantageously, the hierarchal memory system 100 is less complex than traditional bus interconnect systems. Additionally, the processing units 104 are not required to comply with complex protocols of the traditional bus interconnect systems. As a result, the design time and complexity involved in designing the SOC 102 may be improved over that of an SOC that uses a traditional bus interconnect system.

In some embodiments, a cache generator may be used to generate a memory module that represents in software, or another algorithmic-level description, the hierarchal coherent cache 105 in the SOC 102. The software representing the hierarchal coherent cache 105 may be located in storage of a memory. The cache generator may be implemented as a software tool. For example, the cache generator may be included as part of a larger software tool that facilitates the design, testing, and/or fabrication of the SOC 102, including its processing units, other functional blocks, and interconnect systems.

The cache generator may generate the memory module that represents in software the hierarchal coherent cache 105 based on parameters such as the number of processing units, the types of processing units, the associativity scheme of the shared cache 108 relative to the dedicated caches 106. In some embodiments, the cache generator may generate the memory module that represents in software hierarchal coherent cache 105 based on a desired cache size of the shared cache 108 and/or the dedicated caches 106, including physical size constraints of the hierarchal coherent cache 105.

Advantageously, because the communications from the processing units 104 are modeled as accesses to memory, the processing units 104, the hierarchal memory 101, and communications from the processing units 104 may be represented in software, or another algorithmic-level description, and executed by one or more central processing units (CPU). The software representations of processing units may be generally described as processing modules. For example, processing modules representing in software one of the processing units 104, and/or a coherent memory module representing in software a coherent memory associated with the processing units 104 may be received at a CPU of a general-purpose or special-purpose computer, executed, and tested. Testing may include functionally verifying the processing modules and/or testing communication from the processing modules. In some embodiments, a CPU executing multiple threads, such as a multi-core CPU may be used to test the processing modules, coherent memory module, and/or communication from the processing modules.

In some embodiments, processing modules may be received, executed and functionally verified via a homogeneous SOC, defined herein as an SOC including CPU processing units in place of all application-specific processing units of the SOC design. The homogenous SOC may include a coherent memory based on a coherent memory module. The homogenous SOC may be used to test the processing modules, the coherent memory, and/or communications from the processing modules. Processing modules may be alternately or additionally received and executed via a heterogeneous SOC, defined herein as an SOC including at least one application-specific processing unit and CPU processing units in place of fewer than all application-specific processing units in the SOC design.

The memory access model of the processing modules and the memory access model of the processing units may be similar or substantially the same. This means that the memory access module as represented in software may be synthesized into hardware without modification. As a result, processing modules may advantageously be synthesized into a hardware description of the processing units in a hardware description language (HDL) such as register-transfer level (RTL) HDL, Verilog, very-high-speed integrated circuits HDL (VHDL), or the like using hardware synthesis without modifying the processing modules, and in particular, the memory access models of the processing modules.

Figure 3:
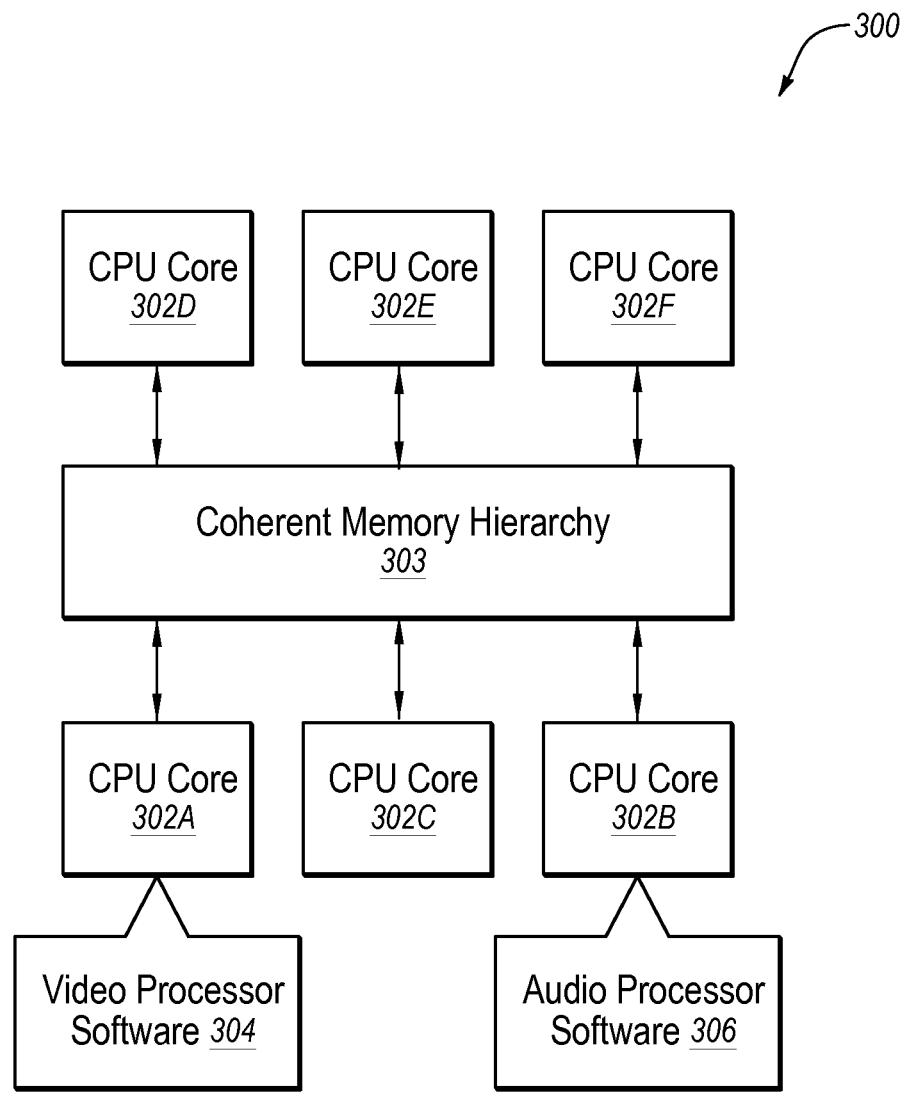
FIG. 3 is a block diagram of an example homogeneous system-on-chip (SOC)

FIG. 3 is a block diagram of an example homogeneous SOC 300, arranged in accordance with at least some embodiments described herein. In some embodiments, the homogenous SOC 300 may initially be used to test one or more processing modules, coherent memory, and/or communications from the processing modules. The processing modules may be updated on the homogeneous SOC 300, for example, as errors and bugs are identified.

The homogeneous SOC includes multiple CPU cores 302 and a coherent memory 303. The CPU cores may receive and execute processing modules. For example, CPU core 302A may receive and execute a processing module, such as video processing software 304, representing a video processor processing unit. As further example, CPU core 302B may receive and execute a processing module, such as audio processing software 306, representing an audio processor processing unit. However, the CPU cores 302 may additionally or alternately receive and execute processing modules representing other processing units. The homogeneous SOC 300 may be implemented in an integrated circuit (IC), a field-programmable gate array (FPGA), or another gate-level implementation.

Figure 4:
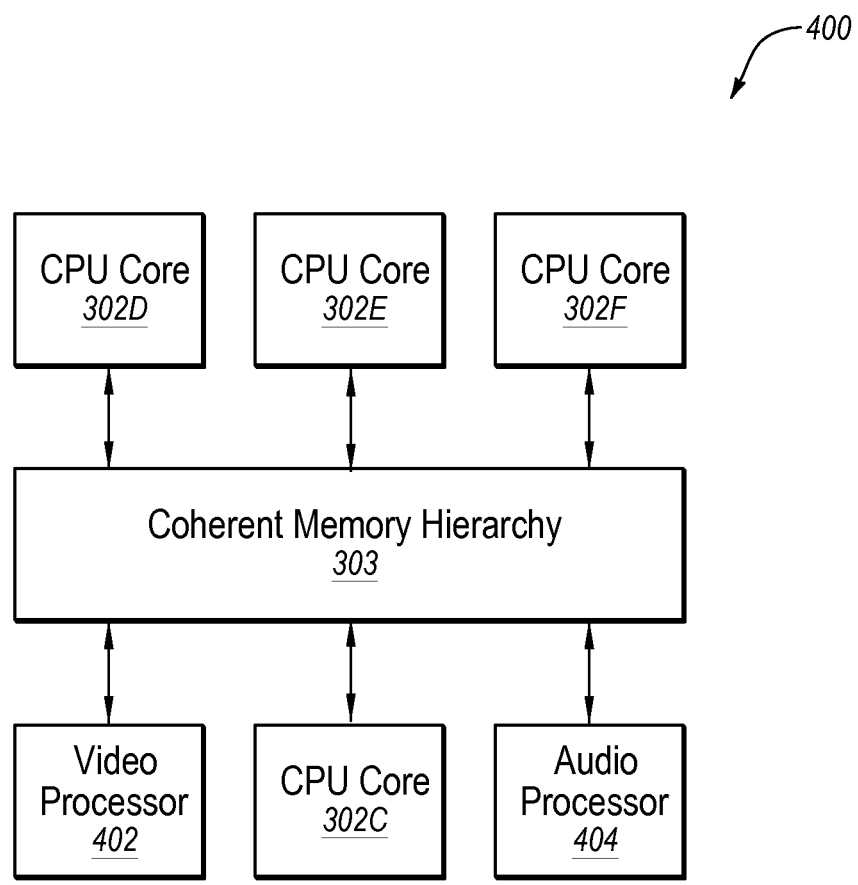
FIG. 4 is a block diagram of an example heterogeneous SOC.

FIG. 4 is a block diagram of an example heterogeneous SOC 400, arranged in accordance with at least some embodiments described herein. In some embodiments, the SOC design methodology may include creating a heterogeneous SOC 400. The heterogeneous SOC 400 may be similar to the homogeneous SOC 300 described with reference to FIG. 3, but has some of the CPU cores replaced by hardware-based processing units synthesized from processing modules. The processing units may include synthesized versions of processing modules that have been functionally verified in the homogeneous SOC 300.

Additional heterogeneous SOCs (not shown) may be created that include additional processing units, for example, as more processing modules are functionally verified. Each additional heterogeneous SOC may be used to test hardware-based processing units, processing modules, the coherent memory 303, and/or communications from the processing units and/or processing modules. Thus, in some embodiments, the SOC design methodology may be one of iteratively creating updated heterogeneous SOCs until a complete SOC is created.

The heterogeneous SOC 400 includes CPU cores 302, a video processor 402, and an audio processor 404. However, other processing units may be additionally or alternately included in the heterogeneous SOC 400. In some embodiments, the processing units included in a particular homogenous SOC 400 may depend on the design of the SOC, on which processing units have been functionally verified through receiving and executing processing modules in CPU cores, and the like. The video processor 402 and the audio processor 404 may be created through hardware synthesis of the functionally verified processing modules of the video processing software and audio processing software 304 and 306 described with reference to FIG. 3.

In some embodiments, the hardware version of the video processing unit 402 and the audio processing unit 404 may be functionally verified in the heterogeneous SOC 400. Additional processing modules may be received and executed by the CPU cores 302, functionally verified, and another heterogeneous SOC (not shown) may be created, again replacing some of the CPU cores with hardware-based processing units. The coherent memory 303 may similarly be updated based on tests of the coherent memory 303 and communications from the processing modules and processing units. The steps of functionally verifying the cores and creating new heterogeneous SOCs may be continued until all processing units have been implemented as processing modules, functionally verified, and synthesized.

Figure 5:
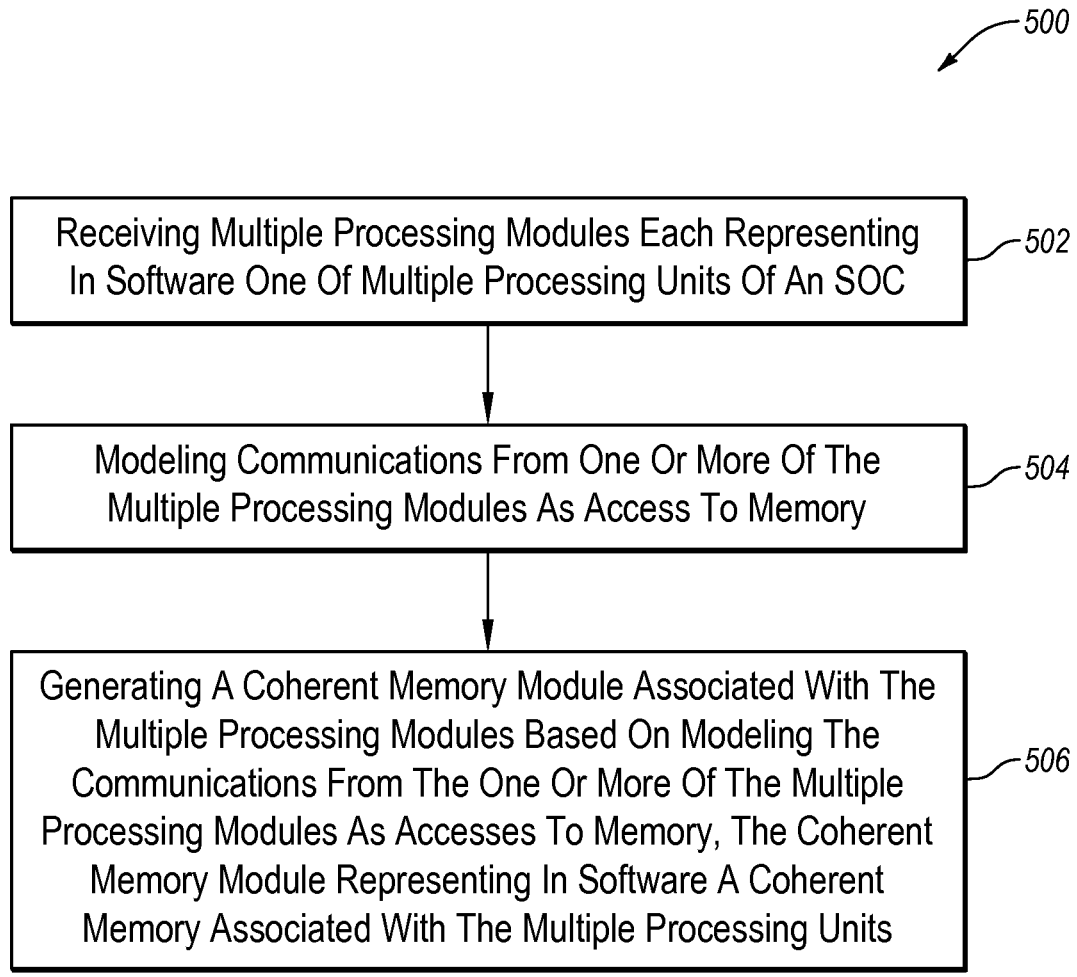
FIG. 5 is a flowchart of an example method of designing an SOC.

FIG. 5 is a flowchart of an example method 500 of designing an SOC, arranged in accordance with at least some embodiments described herein. The method 500 may be implemented by a special purpose or a general-purpose computer or a system, such as a system 602 of FIG. 6. Although FIG. 5 is illustrated as discrete blocks, various blocks may be divided into additional blocks, combined into fewer blocks, or eliminated, depending on the desired implementation.

The method 500 may begin at block 502, in which, multiple processing modules may be received, each processing module representing in software one of multiple processing units of an SOC. The software representing the processing units may be located in storage of a memory. In some embodiments, the processing modules may be generated based on user-selected parameters of desired processing units. Alternately or additionally, received processing modules may be imported, selected from a collection of existing processing modules, or the like. In some embodiments, received processing modules may be created and/or modified by a user. The processing modules may represent any number of different types of processing units, including, but not limited to, a CPU, a GPU, a video processor, an audio processor, a cryptographic engine, an image signal processor, a hardware accelerator, an onboard signal processor, and the like.

In block 504, communications from one or more of the multiple processing modules may be modeled as accesses to memory. In some embodiments, communications from the one or more of the multiple processing modules may be modeled as accesses to memory similar to the memory accesses performed by the processing units as described herein with reference to FIGS. 1 and 2.

In block 506, a coherent memory module associated with the multiple processing modules may be generated based on modeling the communications from the one or more of the multiple processing modules as accesses to memory, the coherent memory module representing in software a coherent memory associated with the multiple processing units. The software representing the coherent memory may be located in storage of a memory. In some embodiments, the coherent memory module may be generated based on one or more design parameters. For example, the coherent memory module may be generated based on a number of processing units, a cache size of a cache associated with the coherent memory, physical constraints of the SOC, an associativity scheme of the cache with respect to one or more dedicated caches each associated with one of the multiple processing units, or the like.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 500 may further include may include generating a hierarchal cache module as at least part of the coherent memory module. The hierarchal cache module may represent in software multiple dedicated caches each associated with one of the multiple processing units. Alternately or additionally, the hierarchal cache module may represent in software a shared cache communicatively coupled to an external shared global memory and each of the plurality of dedicated caches or the multiple processing units.

Alternately or additionally, the method 500 may further include testing the communications from the one or more of the multiple processing modules based on the multiple processing modules and the coherent memory module. Testing the communications from the one or more of the multiple processing modules may include functionally verifying the processing modules. Alternately or additionally, testing the communications may include testing communication speeds, communication performance, and the like.

Furthermore, the method 500 may alternately or additionally include generating a hardware synthesis of the one or more of the multiple processing modules and the coherent memory module. For example, the multiple processing modules and the coherent memory module may be synthesized into an HDL such that an SOC may be created from the resulting HDL description. The multiple processing modules and the coherent memory module may be synthesized into a homogenous SOC or a heterogeneous SOC as described herein with reference to FIGS. 3 and 4. In some embodiments, the communications from the one or more of the multiple processing modules may be tested before generating the hardware synthesis.

Figure 6:
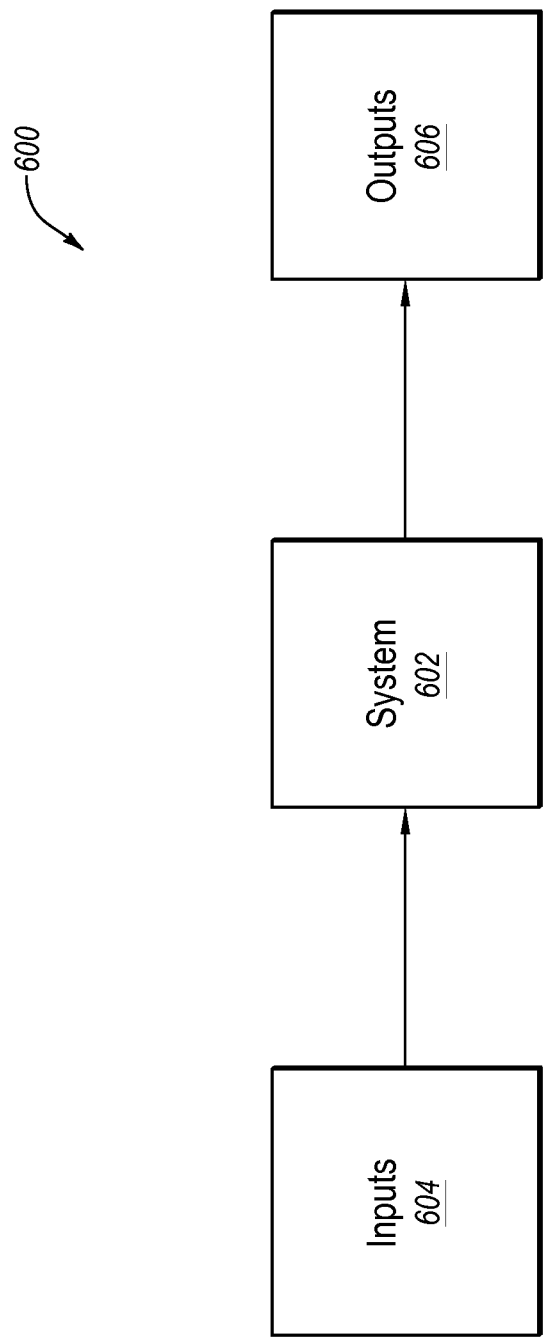
FIG. 6 is a block diagram of an example system organization.

FIG. 6 is a block diagram of an example system organization 600, arranged in accordance with at least some embodiments described herein. The system organization 600 may include a system 602. In some embodiments, the system 602 may include a special-purpose or general-purpose computer. In some embodiments, the system may include a computer-readable medium configured to cause a system to perform operations of designing an SOC. Alternately or additionally, the system may be configured to perform the method 500 described with reference to FIG. 5.

The system 602 may be configured to receive inputs 604. The inputs 604 may generally include information concerning processing modules. The system 602 may generate and/or update processing modules from the inputs 604. Alternately or additionally, the system 602 may generate and/or update processing modules with communications modeled as access to memory. The inputs 604 may include imported processing modules, parameters related to desired processing units from which processing modules may be generated, commands to use a processing module template, modifications to an existing processing module, and the like. The inputs 604 may also include information gathered from testing, including functional verification, which may be used to update a processing module.

The system 602 may also be configured to model communication from processing modules as accesses to memory. In some embodiments, the system may generate a coherent memory module associated with the processing modules received via the inputs 604. The coherent memory module may represent in software a coherent memory associated with the processing modules. The system 602 may test communications from multiple processing modules. In some embodiments, the system may perform a hardware synthesis of the processing modules and the coherent memory module.

The system 602 may also be configured to provide outputs 606. Outputs 606 may include data outputs and/or physical outputs. For example, outputs 606 may include displaying information regarding testing and/or functional verification of processing modules and/or coherent memory modules. Outputs 606 may also include, but are not limited to, the processing modules and/or coherent memory modules; HDL descriptions of processing units and/or coherent memory; and physical SOCs, including homogeneous and/or heterogeneous SOCs generally corresponding to those described herein with reference to FIGS. 3 and 4. In some embodiments, outputs 606 may include error or performance information that may be used by the system 602 to update the processing modules and/or coherent memory modules.

The embodiments described herein may include the use of a special purpose or a general-purpose computer including various computer hardware or software modules, as discussed in greater detail below.

Embodiments described herein may be implemented using computer-readable media for carrying or having software modules, such as program code in the form of computer-executable instructions or data structures, stored thereon. Such computer-readable media may be any available media that may be accessed by a general purpose or special purpose computer. By way of example, and not limitation, such computer-readable media may include tangible computer-readable storage media including random-access memory (RAM), read-only memory (ROM), electrically erasable programmable read-only memory (EEPROM), compact disc read-only memory (CD-ROM) or other optical disk storage, magnetic disk storage or other magnetic storage devices, or any other storage medium which may be used to carry or store desired software modules and which may be accessed by a general purpose or special purpose computer. Combinations of the above may also be included within the scope of computer-readable media.

Computer-executable instructions include, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A method of designing a system-on-chip, the method comprising:
   obtaining a plurality of processing modules each representing in software one of a plurality of processing units of a system-on-chip architecture, the plurality of processing units including a central processor, a video processor, an audio processor, and a graphic processing unit;
   modeling data communications sent between the central processor, the video processor, the audio processor, the graphic processing unit and other processing modules of the plurality of processing modules as accesses to memory;
   generating a coherent memory module associated with the plurality of processing modules based on the modeling of the data communications sent between the central processor, the video processor, the audio processor, the graphic processing unit and the other processing modules as accesses to memory, the coherent memory module representing in software a plurality of first caches, each of the first caches being associated with one of the plurality of processing modules, a second cache communicatively coupled to each of the plurality of first caches, and a cache controller to control the data communications from one or more of the plurality of processing modules to other of the plurality of processing modules by controlling read and write operations between the plurality of first caches and the second cache; and
   implementing the coherent memory module, the central processor, the video processor, the audio processor, and the graphic processing unit of the system-on-chip architecture on a single chip.

2. The method of claim 1, further comprising testing the data communications from the one or more of the plurality of processing modules based on the plurality of processing modules and the coherent memory module.

3. The method of claim 2, further comprising testing the data communications from the one or more of the plurality of processing modules before performing a hardware synthesis of the one or more of the plurality of processing modules and the coherent memory module.

4. The method of claim 1, further comprising generating the coherent memory module based on a design parameter.

5. The method of claim 4, wherein the design parameter includes at least one of a number of processing units, a cache size of one or more of the first plurality of caches and the second cache associated with the coherent memory module, and an associativity scheme of the second cache with respect to one or more of the first plurality of caches.

6. The method of claim 1, further comprising generating a hardware synthesis of the coherent memory module and the plurality of processing modules.

7. A method of designing a system-on-chip, the method comprising:
   obtaining a plurality of processing modules each representing in high-level software, which does not include a hardware description language, one of a plurality of processing units of a system-on-chip architecture, the plurality of processing units including a central processor, a video processor, an audio processor, and a graphic processing unit;
   modeling data communications sent between the central processor, the video processor, the audio processor, the graphic processing unit and other processing modules of the plurality of processing modules as accesses to memory;
   generating a coherent memory module associated with the plurality of processing modules based on the modeling of the data communications sent between the central processor, the video processor, the audio processor, the graphic processing unit and the other processing modules as accesses to memory, the coherent memory module representing in the high-level software a plurality of first caches, each of the first caches being associated with one of the plurality of processing modules, a second cache communicatively coupled to each of the plurality of first caches, and a cache controller to control the data communications from one or more of the plurality of processing modules to other of the plurality of processing modules by controlling read and write operations between the plurality of first caches and the second cache;

validating the data communications between the one or more of the plurality of processing modules using the coherent memory module using the high-level software;

after validating the data communications, synthesizing the coherent memory module into a hardware description of the coherent memory module; and implementing the synthesized coherent memory module, the central processor, the video processor, the audio processor, and the graphic processing unit of the system-on-chip architecture on a single chip.

8. The method of claim 7, wherein before synthesizing the coherent memory module, the method further comprises:

synthesizing one or more of the plurality of processing modules from the high-level software into a register-transfer level description; and validating the data communications between the one or more of the plurality of processing modules represented in the register-transfer level description and the one or more of the plurality of processing modules represented in high-level software using the coherent memory module using the high-level software.

* * * * *